United States Patent [19]
Bhattacharya et al.

[11] Patent Number: 5,731,031
[45] Date of Patent: Mar. 24, 1998

[54] PRODUCTION OF FILMS AND POWDERS FOR SEMICONDUCTOR DEVICE APPLICATIONS

[75] Inventors: Raghu Nath Bhattacharya, Littleton; Rommel Noufi; Li Wang, both of Golden, all of Colo.

[73] Assignee: Midwest Research Institute, Kansas City, Mo.

[21] Appl. No.: 575,862

[22] Filed: Dec. 20, 1995

[51] Int. Cl.$^6$ .................................................. H01L 31/18
[52] U.S. Cl. ........................ 427/76; 427/74; 136/260; 136/264; 136/265; 437/5; 437/225; 437/230; 437/234; 423/508; 423/509; 423/561.1
[58] Field of Search ............... 427/74, 76; 437/5, 437/225, 230, 234; 136/260, 264, 265; 257/43; 423/508–509, 561.1

[56] References Cited

U.S. PATENT DOCUMENTS

| 5,356,839 | 10/1994 | Tuttle et al. | 437/225 |
| 5,436,204 | 7/1995 | Albin et al. | 437/225 |
| 5,441,897 | 8/1995 | Noufi et al. | 437/5 |

OTHER PUBLICATIONS

A.J. Varkey, *Solar Energy Materials*, vol. 19, pp. 415–420 (Dec. 1989).
G.K. Padam, *Thin Solid Films*, vol. 150, pp. L87–L92 (Jun. 1987).
G.K. Padam et al, *Solid Energy Materials*, vol. 13, pp. 297–305 (Jun. 1986).
Bhattacharya, R. N., "Solution Growth and Electrodeposited CuInSe Thin Films," *J. Electrochem. Soc.*; Electrochemical Science and Technology, vol. 130, No. 10, Oct. 1983, pp. 2040–2041.

*Primary Examiner*—Aaron Weisstuch
*Attorney, Agent, or Firm*—Edna M. O'Connor; Ken Richardson

[57] ABSTRACT

A process for chemical bath deposition of selenide and sulfide salts as films and powders employable as precursors for the fabrication of solar cell devices. The films and powders include (1) $Cu_xSe_n$, wherein $x=1-2$ and $n=1-3$; (2) $Cu_xGa_ySe_n$, wherein $x=1-2$, $y=0-1$ and $n=1-3$; (3) $Cu_xIn_ySe_n$, wherein $x=1-2.27$, $y=0.72-2$ and $n=1-3$; (4) $Cu_x(InGa)_ySe_n$, wherein $x=1-2.17$, $y=0.96-2$ and $n=1-3$; (5) $In_ySe_n$, wherein $y=1-2.3$ and $n=1-3$; (6) $Cu_xS_n$, wherein $x=1-2$ and $n=1-3$; and (7) $Cu_x(InGa)_y(SeS)_n$, wherein $x=1-2$, $y=0.07-2$ and $n=0.663-3$. A reaction vessel containing therein a substrate upon which will form one or more layers of semiconductor material is provided, and relevant solution mixtures are introduced in a sufficient quantity for a sufficient time and under favorable conditions into the vessel to react with each other to produce the resultant salt being prepared and deposited as one or more layers on the substrate and as a powder on the floor of the vessel. Hydrazine is present during all reaction processes producing non-gallium containing products and optionally present during reaction processes producing gallium-containing products to function as a strong reducing agent and thereby enhance reaction processes.

31 Claims, 2 Drawing Sheets

PRODUCTION OF FILMS AND POWDERS FOR SEMICONDUCTOR DEVICE APPLICATIONS

The United States Government has rights in this invention under Contract No. DE AC36-83CH10093 between the U.S. Department of Energy and the National Renewable Energy Laboratory, a division of the Midwest Research Institute.

BACKGROUND OF THE INVENTION

1. Field of the Invention

The present invention relates to a process for the chemical bath deposition of selenide and sulfide films and powders including those of copper, copper gallium, copper indium, copper indium gallium and indium for ultimate use as absorbers in the construction of solar cells.

2. Description of the Prior Art

Employment of thin-film solar cell devices whose components are chosen from copper, indium, gallium and selenium or sulfur have demonstrated remarkable total-area efficiencies as well as long-term stability. In particular, an efficiency of 17.1% has been attained from a solar cell having a thin-layer absorber of copper indium gallium selenide (CIGS) wherein the active material is 1–2 µm thick. Other similarly-efficient semiconductors include copper selenide, copper gallium selenide, copper indium selenide, indium selenide, and copper sulfide.

While the efficiency, and thus the desirability, of these films in solar applications is undisputed, present-day production methodology for making film precursor products is generally inefficient. Specifically, a usual manufacturing technique employs a multi-step process that uses physical evaporation of components over a relatively lengthy period of time. Solution growth of copper indium selenide films has been disclosed, but the operating parameters for such film production likewise is burdensome because of time factor, and thus economic, considerations with respect to reaction conditions.

It is therefore apparent that a need is present for a process of preparing precursor films and powders in the family of such products recited above in an efficient and relatively economical manner to thereby ultimately fabricate efficient and relatively economical solar cell devices. Accordingly, a primary object of the present invention is to provide a process for chemical bath deposition of selenide and sulfide salts as precursor films and powders for semiconductor applications in solar devices.

Another object of the present invention is to provide a process wherein copper and indium in combination with each other and with gallium are produced as selenide or sulfide salts deposited as a film or a powder within a reaction vessel.

Yet another object of the present invention is to provide a process wherein hydrazine is included during the production of all non-gallium containing selenide and sulfide films and powders and optionally included in gallium-containing films and powders to function as a strong reducing agent and thereby enhance the reaction process while favorably influencing time factor reduction.

These and other objects of the present invention will become apparent throughout the description of the invention which now follows.

SUMMARY OF THE INVENTION

The present invention is a process for chemical bath deposition of selenide and sulfide salts as films and powders employable as precursors for the fabrication of solar cell devices. The films and powders include (1) $Cu_xSe_n$, wherein $x=1-2$ and $n=1-3$; (2) $Cu_xGa_ySe_n$, wherein $x=1-2$, $y=0-1$ and $n=1-3$; (3) $Cu_xIn_ySe_n$, wherein $x=1-2.27$, $y=0.72-2$ and $n=1-3$; (4) $Cu_x(InGa)_ySe_n$, wherein $x=1-2.17$, $y=0.96-2$ and $n=1-3$; (5) $In_ySe_n$, wherein $y=1-2.3$ and $n=1-3$; (6) $Cu_xS_n$, wherein $x=1-2$ and $n=1-3$; and (7) $Cu_x(InGa)_y(SeS)_n$, wherein $x=1-2$, $y=0.07-2$ and $n=0.663-3$. A reaction vessel containing therein a substrate upon which will form one or more layers of semiconductor material is provided, and relevant solution mixtures are introduced into the vessel in a sufficient quantity to react with each other to produce the resultant salt being prepared. Hydrazine is present during all reaction processes producing non-gallium containing products and optionally present during reaction processes producing gallium-containing products to function as a strong reducing agent and thereby enhance reaction processes. The pH of the solution mixture is maintained between about 7 and 14 during the reaction, and the reaction is allowed to proceed for a time sufficient to produce the salt which deposits as a layer on the substrate and as a powder within the vessel. Thereafter, the film and powder can be treated as by annealing in an inert gas such as argon for subsequent final preparation in the fabrication of solar cell devices. The as-deposited films can also be integrated with the physical evaporation technique as known in the art to thereby have the potential of lowering the cost of fabricating high-efficiency solar cells.

One reactant solution within the solution employed for the preparation of all selenide films and powders is a selenium compound solution such as a $Na_2SeSO_3$/water reactant solution. For sulfide films and powders, a sulfur compound solution such as a thiourea/water reactant solution is present. For those products containing copper, a copper compound solution such as a $CuSO_4$/water reactant solution is present; for those products containing gallium, a gallium compound solution such as a $Ga_2(SO_4)_3$/water reactant solution is present; and for those products containing indium, an indium compound solution such as an $InCl_3$/triethanolamine/water reactant solution is present.

The process of the present invention achieves production of precursor films and powders for subsequent use in the fabrication of solar cell devices. This film and powder production is accomplished efficiently, simultaneously, and in a timely and economically-favorable manner to thereby contribute toward solar cell construction in a likewise-efficient way.

DETAILED DESCRIPTION OF THE PREFERRED EMBODIMENT

Figure 1A:
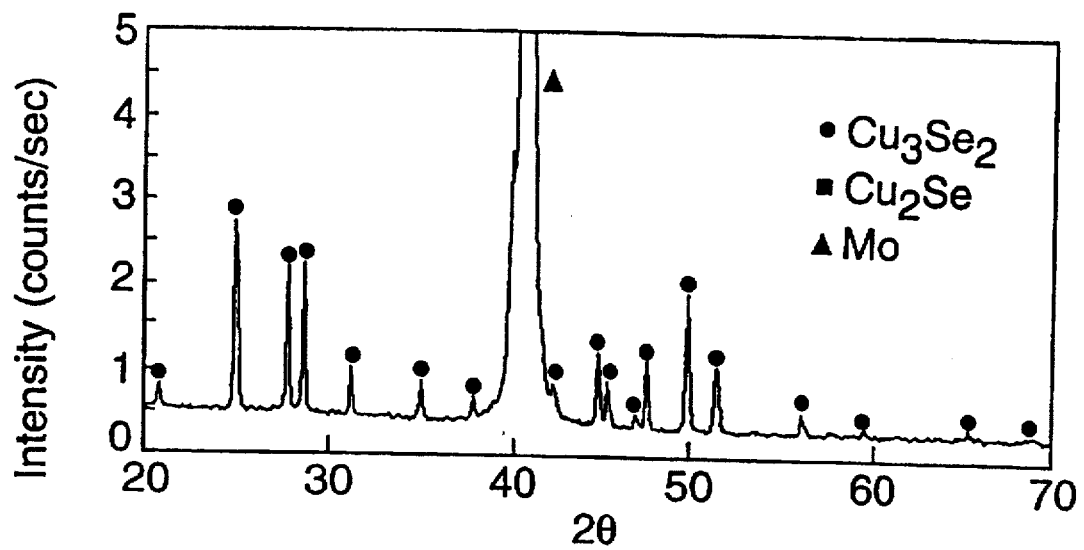
FIG. 1a is a graph of x-ray diffusion analysis of an as-deposited Cu-Se film.

The present invention is a process for chemical bath deposition of selenide and sulfide semiconductor film and powder for ultimate use in the construction of solar cell devices. In the Examples that follow, all chemicals were of Analar- or Puratronic-grade and were used as received. The substrates used were glass/Mo substrates, with a Mo film deposited by dc-sputtering to a thickness of about 1 μm. All substrates were degreased with propanol and dried with flowing nitrogen. All of the reactant solutions used in the Examples were prepared as follows: (1) sodium selenosulfate ($Na_2SeSO_3$) solution was prepared by refluxing 10 gm Se with 50 gm $Na_2SO_3$ in 500 ml deionized (DI) water at ≈150° C. for two hours; (2) indium chloride ($InCl_3$) solution was prepared by stirring 0.6 gm $InCl_3$, 30 ml triethanolamine and 70 ml DI water; (3) copper sulfate ($CuSO_4$) solution was prepared by dissolving 22.3 gm $CuSO_4$ directly in 100 ml DI water; (5) gallium sulfate ($Ga_2(SO_4)_3$) solution was prepared by dissolving 4.27 gm $Ga_2(SO4)_3$ directly in 100 ml DI water; and (6) thiourea ($NH_2CSNH_2$) solution was prepared by dissolving 7.60 gm thiourea directly in 100 ml DI water. A hydrazine ($NH_2NH_2$) solution was prepared to be 5% by volume, and ammonium hydroxide ($NH_4OH$) and sodium hydroxide (NaOH) solutions were prepared to be 10% by volume.

EXAMPLE 1

Figure 1B:
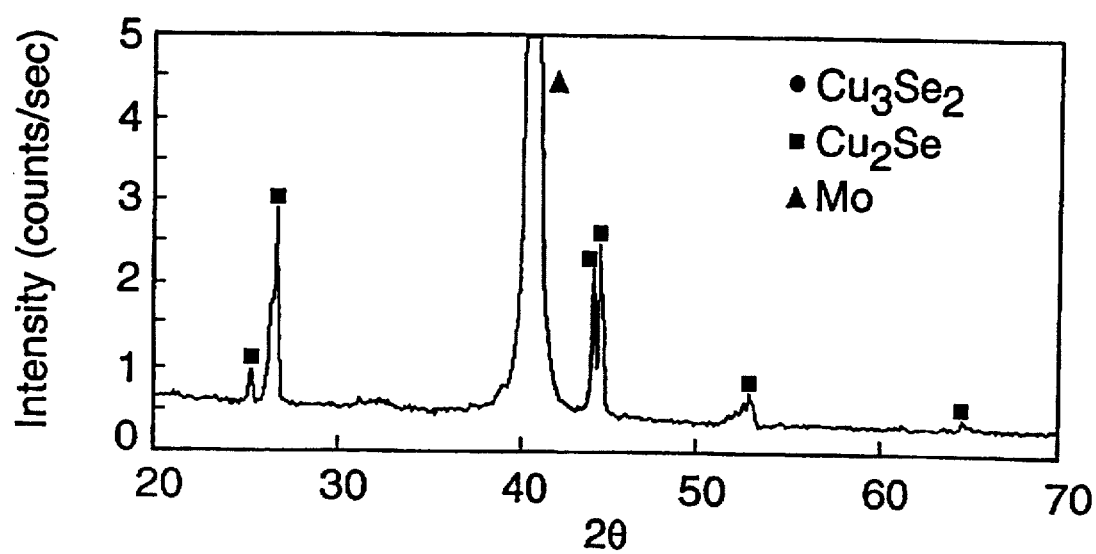
FIG. 1b is a graph of x-ray diffusion analysis of an annealed Cu-Se film.

A vessel containing a glass/Mo substrate was provided for the deposition of Cu-Se film layers on the substrate and Cu-Se powder precipitate on the floor of the vessel. A solution mixture of 0.15M $Na_2SeSO_3$, $1.25 \times 10^{-2}$M $CuSO_4$ and 0.005M hydrazine was introduced into the vessel and the pH was adjusted to 11.6 with $NH_4OH$. The deposition was performed at a solution temperature of about 85° C., but can be performed at a temperature range of from about 25° C. to about 100° C. The rate of deposition of resulting Cu-Se film layers averaged 0.037 μm/minute for the first 30 minutes of deposition and the layers adhered well to the substrate. Simultaneously, Cu-Se powder precipitated on the floor of the vessel. Electron probe microanalysis revealed that the as-deposited film composition was $Cu_{1.8}Se$, and changed to $Cu_2Se$ after annealing at 450° C. for 30 minutes. X-ray diffraction analysis of the as-deposited film showed predominantly $Cu_3Se_2$ phase, as shown in FIG. 1a. X-ray diffraction analysis of the annealed film showed predominantly a $Cu_2Se$ phase, as shown in FIG. 1b.

EXAMPLE 2

In the same manner as in Example 1, a vessel containing a glass/Mo substrate was provided, except for the deposition of Cu-Ga-Se film layers on the substrate and Cu-Ga-Se powder precipitate on the floor of the vessel. A solution mixture of 0.15M $Na_2SeSO_3$, $1.25 \times 10^{-2}$M $CuSO_4$, $3.3 \times 10^{-3}$M $Ga_2(SO_4)_3$ and 0.005M hydrazine was introduced into the vessel and the pH was adjusted to 11.6 with $NH_4OH$. The deposition was performed at a solution temperature of about 85° C., but can be performed at a temperature range of from about 25° C. to about 100° C. The rate of deposition of resulting Cu-Ga-Se film layers averaged 0.017 μm/minute for the first 30 minutes of deposition and the layers adhered well to the substrate. Simultaneously, Cu-Ga-Se powder precipitated on the floor of the vessel. Electron probe microanalysis revealed that the as-deposited film composition was $Cu_{1.7}Ga_{0.01}Se$, and changed to $Cu_{1.9}Ga_{0.01}Se$ after annealing at 450° C. for 30 minutes. X-ray diffraction analysis were the same as the Cu-Se film of Example 1.

EXAMPLE 3

Figure 2A:
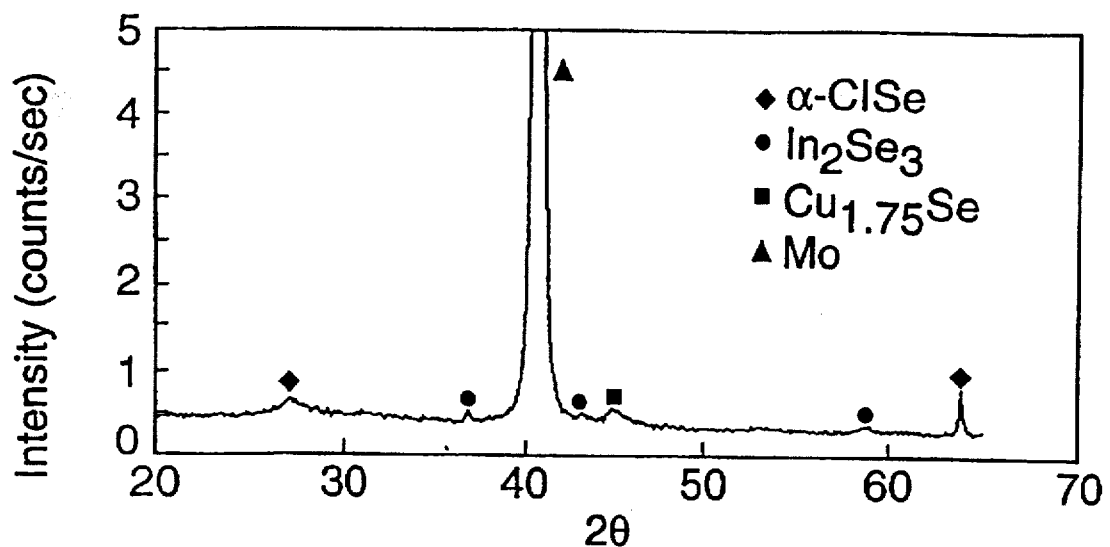
FIG. 2a is a graph of x-ray diffusion analysis of an as-deposited Cu-In-Se film.
Figure 2B:
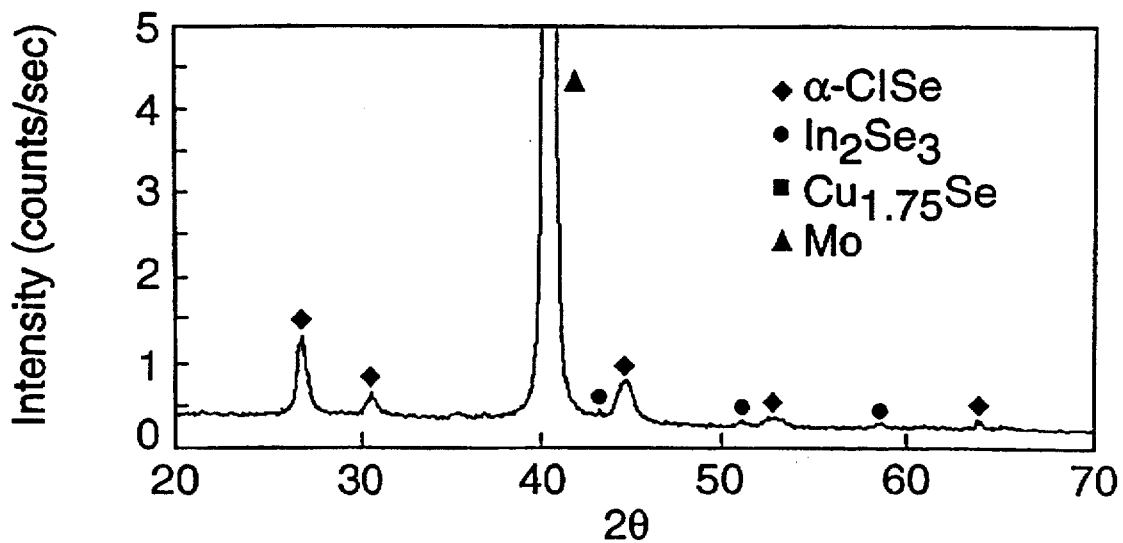
FIG. 2b is a graph of x-ray diffusion analysis of an annealed Cu-In-Se film.

In the same manner as in Example 1, a vessel containing a glass/Mo substrate was provided, except for the deposition of Cu-In-Se film layers on the substrate and Cu-In-Se powder precipitate on the floor of the vessel. A solution mixture of 0.05M $Na_2SeSO_3$, 0.01M $CuSO_4$, 0.017M $InCl_3$ and 0.005M hydrazine was introduced into the vessel and the pH was adjusted to 9.9 with $NH_4OH$. The deposition was performed at a solution temperature of about 85° C., but can be performed at a temperature range of from about 25° C. to about 100° C. The rate of deposition of resulting Cu-In-Se film layers averaged 0.023 μm/minute for the first 30 minutes of deposition and the layers adhered well to the substrate. Simultaneously, Cu-In-Se powder precipitated on the floor of the vessel. Electron probe microanalysis revealed that the as-deposited film composition was $Cu_{2.27}In_{0.72}Se_2$, and changed to $Cu_{2.32}In_{0.72}Se_2$ after annealing at 450° C. for 30 minutes. X-ray diffraction analysis of the as-deposited film showed a mixture of $Cu_{1.75}Se$, $In_2Se_3$ and $CuInSe_2$ phases, as shown in FIG. 2a. X-ray diffraction analysis of the annealed film showed a mixture of $In_2Se_3$ and $CuInSe_2$ phases, as shown in FIG. 2b.

EXAMPLE 4

In the same manner as in Example 1, a vessel containing a glass/Mo substrate was provided, except for the deposition of Cu-In-Ga-Se film layers on the substrate and Cu-In-Ga-Se powder precipitate on the floor of the vessel. A solution mixture of 0.04M $Na_2SeSO_3$, $4.2 \times 10^{-3}$M $CuSO_4$, 0.017M $InCl_3$, $3.3 \times 10^{-3}$M $Ga_2(SO_4)_3$, and 0.005M hydrazine was introduced into the vessel and the pH was adjusted to 9.9 with $NH_4OH$. The deposition was performed at a solution temperature of about 85° C., but can be performed at a temperature range of from about 25° C. to about 100° C. The rate of deposition of resulting Cu-In-Ga-Se film layers averaged 0.033 μm/minute for the first 30 minutes of deposition and the layers adhered well to the substrate. Simultaneously, Cu-In-Ga-Se powder precipitated on the floor of the vessel. Electron probe microanalysis revealed that the as-deposited film composition was $Cu_{2.17}In_{0.91}Ga_{0.05}Se_2$, and changed to $Cu_{2.26}In_{0.85}Ga_{0.04}Se_2$ after annealing at 450° C. for 30 minutes. X-ray diffraction analysis were the same as the Cu-In-Se film of Example 3.

EXAMPLE 5

In the same manner as in Example 1, a vessel containing a glass/Mo substrate was provided, except that a thin (≈300Å) Cu-Se layer was first deposited onto the molybdenum. This layer was prepared from a solution mixture of 0.15 $Na_2SeSO_3$ and $8 \times 10^{-4}$M $CuSO_4$. The pH was adjusted to 11.6 with $NH_4OH$, and deposition time was two minutes. Thereafter, a solution mixture of 0.01M $Na_2SeSO_3$, 0.006M $InCl_3$, and 0.005M hydrazine was introduced into the vessel and the pH was adjusted to 10.4 with $NH_4OH$. The deposition was performed at a solution temperature of about 85° C., but can be performed at a temperature range of from about 25° C. to about 100° C. The rate of deposition of resulting In-Se film layers averaged 0.033 μm/minute for the first 30 minutes of deposition, but the layers did not adhere well to the substrate. Simultaneously, In-Se powder precipitated on the floor of the vessel. Electron probe microanalysis revealed that the as-deposited film composition was $In_{2.3}Se_3$.

EXAMPLE 6

In the same manner as in Example 1, a vessel containing a glass/Mo substrate was provided, except for the deposition of Cu-S film layers on the substrate and Cu-S powder precipitate on the floor of the vessel. A solution mixture of 0.125M thiourea, 0.037M $CuSO_4$ and 0.005M hydrazine was introduced into the vessel and the pH was adjusted to 11.6 with $NH_4OH$. The deposition was performed at a solution temperature of about 85° C., but can be performed at a temperature range of from about 25° C. to about 100° C. Electron probe microanalysis revealed that the as-deposited film composition was $Cu_{1.8}S$.

EXAMPLE 7

In the same manner as in Example 1, a vessel containing a glass/Mo substrate was provided, except for the deposition of Cu-In-Ga-Se-S film layers on the substrate and Cu-In-Ga-Se-S powder precipitate on the floor of the vessel. A solution mixture of 0.208M thiourea, 0.030M $Na_2SeO_3$, 0.01M $InCl_3$, 0.05M $CuSO_4$, $3.3\times10^{-3}M$ $Ga_2(SO_4)_3$, and 0.005M hydrazine was introduced into the vessel and the pH was adjusted to 11.6 with $NH_4OH$. The deposition was performed at a solution temperature of about 85° C., but can be performed at a temperature range of from about 25° C. to about 100° C. Electron probe microanalysis revealed the as-deposited film composition was $CuIn_{0.02}Ga_{0.05}Se_{0.66}S_{0.003}$.

As is apparent from the above Examples, precursor semiconductor films and powders for ultimate use in the fabrication of solar cell devices are efficiently produced according to the principles of the present invention. The presence of hydrazine as taught in the invention is a major contributor toward semiconductor production because of its strong reducing characteristics which enhance the reaction processes above described. The products thus produced are ready for incorporation into solar cell construction as known in the art.

While an illustrative and presently preferred embodiment of the invention has been described in detail herein, it is to be understood that the inventive concepts may be otherwise variously embodied and employed and that the appended claims are intended to be construed to include such variations except insofar as limited by the prior art.

We claim:

1. A process for chemical bath deposition of $Cu_xSe_n$, wherein $x=1-2$ and $n=1-3$, the process comprising:
   a) providing a reaction vessel containing therein a substrate upon which one or more layers of $Cu_xSe_n$ will form;
   b) providing a solution mixture of a selenium compound, a copper compound, and hydrazine within the vessel, with the selenium compound and copper compound each in a sufficient quantity to react with each other to produce $Cu_xSe_n$;
   c) adjusting the pH of the solution mixture to a value of about 7 to 14 by adding a base thereto; and
   d) allowing the selenium compound and copper compound of the solution mixture to react for a time sufficient to produce $Cu_xSe_n$ which deposits as a layer on the substrate and as a powder within the vessel.

2. A process as claimed in claim 1 wherein the selenium compound and copper compound are $Na_2SeO_3$ and $CuSO_4$, respectively.

3. A process as claimed in claim 2 wherein the solution mixture comprises about 0.15M $Na_2SeO_3$, about $1.25\times10^{-2}M$ $CuSO_4$, and about 0.005M hydrazine.

4. A process as claimed in claim 3 wherein the base is selected from the group consisting of $NH_4OH$ and NaOH and wherein the pH is adjusted to about 11.6.

5. A process for chemical bath deposition of $Cu_xGa_ySe_n$, wherein $x=1-2$, $y=0-1$, and $n=1-3$, the process comprising:
   a) providing a reaction vessel containing therein a substrate upon which one or more layers of $Cu_xGa_ySe_n$ will form;
   b) providing a solution mixture of a selenium compound, a copper compound, and a gallium compound within the vessel, with the selenium compound, copper compound, and gallium compound each in a sufficient quantity to react with each other to produce $Cu_xGa_ySe_n$;
   c) adjusting the pH of the solution mixture to a value of about 7 to 14 by adding a base thereto; and
   d) allowing the selenium compound, copper compound, and gallium compound of the solution mixture to react for a time sufficient to produce $Cu_xGa_ySe_n$ which deposits as a layer on the substrate and as a powder within the vessel.

6. A process as claimed in claim 5 wherein the selenium compound, copper compound, and gallium compound are $Na_2SeO_3$, $CuSO_4$, and $Ga_2(SO_4)_3$, respectively.

7. A process as claimed in claim 6 wherein hydrazine is additionally present within the solution mixture.

8. A process as claimed in claim 7 wherein the solution mixture comprises about 0.15M $Na_2SeO_3$, about $1.25\times10^{-2}M$ $CuSO_4$, and about $3.3\times10^{-3}M$ $Ga_2(SO_4)_3$, and about 0.005M hydrazine.

9. A process as claimed in claim 8 wherein the base is selected from the group consisting of $NH_4OH$ and NaOH and wherein the pH is adjusted to about 11.6.

10. A process for chemical bath deposition of $Cu_xIn_ySe_n$, wherein $x=1-2.27$, $y=0.72-2$, and $n=1-3$, the process comprising:
    a) providing a reaction vessel containing therein a substrate upon which one or more layers of $Cu_xIn_ySe_n$ will form;
    b) providing a solution mixture of a selenium compound, a copper compound, an indium compounds and hydrazine within the vessel, with the selenium compound, copper compound, and indium compound each in a sufficient quantity to react with each other to produce $Cu_xIn_ySe_n$;
    c) adjusting the pH of the solution mixture to a value of about 7 to 14 by adding a base thereto; and
    d) allowing the selenium compound, copper compound, and indium compound of the solution mixture to react for a time sufficient to produce $Cu_xIn_ySe_n$ which deposits as a layer on the substrate and as a powder within the vessel.

11. A process as claimed in claim 10 wherein the selenium compound, copper compound, and indium compound are $Na_2SeO_3$, CuSO4, and $InCl_3$, respectively.

12. A process as claimed in claim 11 wherein the solution mixture comprises about 0.05M $Na_2SeO_3$, about 0.01M $CuSO_4$, about 0.017M $InCl_3$, and about 0.005M hydrazine.

13. A process as claimed in claim 12 wherein the base is selected from the group consisting of $NH_4OH$ and NaOH and wherein the pH is adjusted to about 9.9.

14. A process for chemical bath deposition of $Cu_x(InGa)_ySe_n$, wherein $x=1-2.17$, $y=0.96-2$ and $n=1-3$, the process comprising:
    a) providing a reaction vessel containing therein a substrate upon which one or more layers of $Cu_x(InGa)_ySe_n$ will form;
    b) providing a solution mixture of a selenium compound, a copper compound, an indium compound, and a gallium compound within the vessel, with the selenium compound, copper compound, indium compound, and gallium compound each in a sufficient quantity to react with each other to produce $Cu_x(InGa)_ySe_n$;
    c) adjusting the pH of the solution mixture to a value of about 7 to 14 by adding a base thereto; and d) allowing the selenium compound, copper compound, indium compound, and gallium compound of the solution mixture to react for a time sufficient to produce $Cu_x(InGa)_ySe_n$ which deposits as a layer on the substrate and as a powder within the vessel.

15. A process as claimed in claim 14 wherein the selenium compound, copper compound, indium compound, and gallium compound respectively are $Na_2SeSO_3$, $CuSO_4$, $InCl_3$, and $Ga_2(SO_4)_3$.

16. A process as claimed in claim 15 wherein hydrazine is additionally present within the solution mixture.

17. A process as claimed in claim 16 wherein the solution mixture comprises about 0.04M $Na_2SeSO_3$, about $4.2\times10^{-3}$ M $CuSO_4$, about 0.017M $InCl_3$, about $3.3\times10^{-3}$ $Ga_2(SO_4)_3$, and about 0.005M hydrazine.

18. A process as claimed in claim 17 wherein the base is selected from the group consisting of $NH_4OH$ and $NaOH$, and wherein the pH is adjusted to about 11.6.

19. A process for chemical bath deposition of $In_ySe_n$, wherein y=1–2.3 and n=1–3, the process comprising:
   a) providing a reaction vessel containing therein a substrate upon which one or more layers of $In_ySe_n$ will form;
   b) providing a solution mixture of a selenium compound, an indium compound, and hydrazine within the vessel, with the selenium compound and indium compound each in a sufficient quantity to react with each other to produce $In_ySe_n$;
   c) adjusting the pH of the solution mixture to a value of about 7 to 14 by adding a base thereto; and
   d) allowing the selenium compound and indium compound of the solution mixture to react for a time sufficient to produce $In_ySe_n$ which deposits as a layer on the substrate and as a powder within the vessel.

20. A process as claimed in claim 19 wherein the selenium compound and indium compound are $Na_2SeSO_3$ and $InCl_3$, respectively.

21. A process as claimed in claim 20 wherein the solution mixture comprises about 0.01M $Na_2SeSO_3$, about 0.006M $InCl_3$, and about 0.005 hydrazine.

22. A process as claimed in claim 21 wherein the base is selected from the group consisting of $NH_4OH$ and $NaOH$, and wherein the pH is adjusted to about 10.4.

23. A process for chemical bath deposition of $Cu_xS_n$, wherein x=1–2 and n=1–3, the process comprising:
   a) providing a reaction vessel containing therein a substrate upon which one or more layers of $Cu_xS_n$ will form;
   b) providing a solution mixture of a sulfur compound, a copper compound, and hydrazine within the vessel, with the sulfur compound and copper compound each in a sufficient quantity to react with each other to produce $Cu_xS_n$;

c) adjusting the pH of the solution mixture to a value of about 7 to 14 by adding a base thereto; and d) allowing the sulfur compound and copper compound of the solution mixture to react for a time sufficient to produce $Cu_xS_n$ which deposits as a layer on the substrate and as a powder within the vessel.

24. A process as claimed in claim 23 wherein the sulfur compound and the copper compound are thiourea and $CuSO_4$, respectively.

25. A process as claimed in claim 24 wherein the solution mixture comprises about 0.125M thiourea, about 0.037M $CuSO_4$, and about 0.005M hydrazine.

26. A process as claimed in claim 25 wherein the base is selected from the group consisting of $NH_4OH$ and $NaOH$, and wherein the pH is adjusted to about 11.6.

27. A process for chemical bath deposition of $Cu_x(InGa)_y(SeS)_n$, wherein x=1–2, y=0.07–2, and n=0.663–3, the process comprising:
   a) providing a reaction vessel containing therein a substrate upon which one or more layers of $Cu_x(InGa)_y(SeS)_n$ will form;
   b) providing a solution mixture of a selenium compound, a copper compound, an indium compound, a gallium compound, and a sulfur compound within the vessel, with the selenium compound, copper compound, indium compound, gallium compound, and sulfur compound each in a sufficient quantity to react with each other to produce $Cu_x(InGa)_y(SeS)_n$;
   c) adjusting the pH of the solution mixture to a value of about 7 to 14 by adding a base thereto; and
   d) allowing the selenium compound, copper compound, indium compound, gallium compound, and sulfur compound of the solution mixture to react for a time sufficient to produce $Cu_x(InGa)_y(SeS)_n$ which deposits as a layer on the substrate and as a powder within the vessel.

28. A process as claimed in claim 27 wherein the selenium compound, copper compound, indium compound, gallium compound, and sulfur compound respectively are $Na_2SeSO_3$, $CuSO_4$, $InCl_3$, $Ga_2(SO_4)_3$, and thiourea.

29. A process as claimed in claim 28 wherein hydrazine is additionally present within the solution mixture.

30. A process as claimed in claim 29 wherein the solution mixture comprises about 0.03M $Na_2SeSO_3$, about 0.05M $CuSO_4$, about 0.01M $InCl_3$, about $3.3\times10^{-3}$M $Ga_2(SO_4)_3$, about 0.208M thiourea, and about 0.005M hydrazine.

31. A process as claimed in claim 30 wherein the base is selected from the group consisting of $NH_4OH$ and $NaOH$, and wherein the pH is adjusted to about 11.6.

* * * * *